US010656688B2

(12) United States Patent
Voth et al.

(10) Patent No.: US 10,656,688 B2
(45) Date of Patent: *May 19, 2020

(54) THERMAL MANAGEMENT SYSTEM INCLUDING AN ELASTICALLY DEFORMABLE PHASE CHANGE DEVICE

(71) Applicant: Microsoft Technology Licensing, LLC, Redmond, WA (US)

(72) Inventors: David William Voth, Woodinville, WA (US); Andrew Douglas Delano, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 14 days.

This patent is subject to a terminal disclaimer.

(21) Appl. No.: 15/647,067

(22) Filed: Jul. 11, 2017

(65) Prior Publication Data
US 2017/0315598 A1  Nov. 2, 2017

Related U.S. Application Data

(63) Continuation of application No. 15/072,323, filed on Mar. 16, 2016, now Pat. No. 9,733,680.

(51) Int. Cl.
*G06F 1/16* (2006.01)
*G06F 1/20* (2006.01)
(Continued)

(52) U.S. Cl.
CPC ......... *G06F 1/203* (2013.01); *F28D 15/0241* (2013.01); *F28D 15/04* (2013.01);
(Continued)

(58) Field of Classification Search
CPC ............. G06F 1/181–182; G06F 1/203; G06F 1/1632; G06F 1/206;
(Continued)

(56) References Cited

U.S. PATENT DOCUMENTS 5,097,804 A * 3/1992 Brune ...................... F16D 3/10
  123/90.17
5,168,921 A * 12/1992 Meyer, IV .......... F28D 15/0233
  165/104.14
(Continued)

FOREIGN PATENT DOCUMENTS

| CN | 1540751 | 10/2004 |
|---|---|---|
| CN | 103336564 A | 10/2013 |
| TW | 566075 | 12/2003 |

OTHER PUBLICATIONS

"Heat Pipe Solutions: Flexible Heat Pipes", Thermacore, Jan. 21, 2010, Available at: http://www.thermacore.com/products/flexible.aspx.

(Continued)

*Primary Examiner* — Jayprakash N Gandhi
*Assistant Examiner* — Razmeen Gafur
(74) *Attorney, Agent, or Firm* — Ray Quinney & Nebeker P.C.; John O. Carpenter

(57) ABSTRACT

Thermal management systems and corresponding use methods are described herein. A thermal management system includes components of a computing device. The computing device includes a housing. The housing includes an outer surface and an inner surface. The computing device also includes a heat generating component supported by the housing. The computing device includes a phase change device adjacent or physically connected to the heat generating component. The phase change device includes a first side and a second side. The first side is closer to the heat generating component than the second side. The second side is opposite the first side. The phase change device is compressible, such that when a force is applied to the outer surface of the housing, the inner surface of the housing (Continued)

flexes towards the second side of the phase change device and the phase change device is compressed.

15 Claims, 5 Drawing Sheets

(51) Int. Cl.
    *H05K 7/20*         (2006.01)
    *F28D 15/02*       (2006.01)
    *F28D 15/04*       (2006.01)
    *H01L 23/427*     (2006.01)
    *H01L 35/00*      (2006.01)

(52) U.S. Cl.
    CPC ............ *G06F 1/1632* (2013.01); *G06F 1/206* (2013.01); *H01L 23/427* (2013.01); *H05K 7/20309* (2013.01); *H05K 7/20336* (2013.01); *H01L 35/00* (2013.01)

(58) Field of Classification Search
    CPC .......................... H05K 7/20218–20381; H05K 7/20409–20418; H05K 7/20009–202; H05K 7/20309; H05K 7/20336; H05K 7/20; H01L 23/367–3677; H01L 23/473; H01L 23/46–467; H01L 23/427; F28D 15/0241; F28D 15/04
    USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
    See application file for complete search history.

(56) References Cited

U.S. PATENT DOCUMENTS

| | | | |
|---|---|---|---|
| 5,388,635 A | 2/1995 | Gruber et al. | |
| 5,560,423 A | 10/1996 | Larson et al. | |
| 5,730,614 A * | 3/1998 | Yu | H01R 12/7005 439/326 |
| 5,944,093 A * | 8/1999 | Viswanath | F28D 15/0241 165/104.26 |
| 6,047,766 A | 4/2000 | Van Brocklin et al. | |
| 6,064,572 A * | 5/2000 | Remsburg | H01L 23/4336 165/80.4 |
| 6,084,769 A | 7/2000 | Moore et al. | |
| 6,109,039 A * | 8/2000 | Hougham | G06F 1/203 62/259.2 |
| 6,181,553 B1 | 1/2001 | Cipolla et al. | |
| 6,343,010 B1 | 1/2002 | Tanaka | |
| 6,445,580 B1 * | 9/2002 | Cohen | G06F 1/20 257/E23.082 |
| 6,446,706 B1 | 9/2002 | Rosenfeld et al. | |
| 6,966,358 B2 * | 11/2005 | Rapaich | G06F 1/1632 165/104.33 |
| 7,224,099 B2 | 5/2007 | Magnussen | H01L 41/0906 29/25.35 |
| 7,342,783 B2 | 3/2008 | Park | |
| 7,925,813 B2 * | 4/2011 | Mok | G06F 1/1632 710/304 |
| 8,069,907 B2 | 12/2011 | Bryant et al. | |
| 8,741,076 B2 * | 6/2014 | Gao | F03G 7/065 148/402 |
| 8,982,560 B2 * | 3/2015 | MacDonald | G06F 1/203 165/104.26 |
| 9,935,033 B2 * | 4/2018 | Smith | H01L 23/3672 |
| 10,007,298 B2 * | 6/2018 | Shibayama | G06F 1/1616 |
| 2001/0033475 A1 * | 10/2001 | Lillios | G06F 1/1632 361/679.54 |
| 2001/0040788 A1 | 11/2001 | O'Connor et al. | |
| 2002/0018335 A1 * | 2/2002 | Koizumi | G06F 1/1632 361/679.47 |
| 2002/0105783 A1 * | 8/2002 | Kitahara | G06F 1/1632 361/695 |
| 2002/0145852 A1 | 10/2002 | DeHoff et al. | |
| 2003/0116924 A1 * | 6/2003 | White | F16J 15/064 277/630 |
| 2004/0052052 A1 * | 3/2004 | Rivera | H01L 23/427 361/700 |
| 2005/0122678 A1 | 6/2005 | Patel et al. | |
| 2006/0109630 A1 | 5/2006 | Colgan et al. | |
| 2006/0231990 A1 * | 10/2006 | Born | F16F 9/0209 267/64.14 |
| 2007/0034355 A1 | 2/2007 | Kuo | |
| 2007/0056714 A1 * | 3/2007 | Wong | F28D 15/0233 165/104.26 |
| 2007/0127210 A1 | 6/2007 | Mahalingam et al. | |
| 2007/0199340 A1 | 8/2007 | Knight et al. | |
| 2007/0201206 A1 | 8/2007 | Farrow et al. | |
| 2008/0099186 A1 * | 5/2008 | Yu | F28D 15/0241 165/104.11 |
| 2008/0165502 A1 | 7/2008 | Furman et al. | |
| 2008/0179047 A1 | 7/2008 | Yesin et al. | |
| 2008/0247177 A1 * | 10/2008 | Tanaka | F21S 8/026 362/373 |
| 2008/0266801 A1 * | 10/2008 | Weiss | H01L 23/427 361/700 |
| 2008/0266808 A1 * | 10/2008 | Aberg | H01L 23/4006 361/709 |
| 2009/0114370 A1 | 5/2009 | Konig | |
| 2009/0116192 A1 | 5/2009 | McCullough et al. | |
| 2009/0122491 A1 * | 5/2009 | Martin | H01L 23/367 361/708 |
| 2010/0008036 A1 * | 1/2010 | Risher-Kelly | G06F 1/1632 361/679.47 |
| 2010/0295653 A1 * | 11/2010 | Pinto | H01H 37/323 337/126 |
| 2010/0296248 A1 | 11/2010 | Campbell et al. | |
| 2010/0328888 A1 | 12/2010 | Campbell et al. | |
| 2011/0075377 A1 | 3/2011 | Paquette et al. | |
| 2011/0127024 A1 * | 6/2011 | Patel | G06F 1/20 165/200 |
| 2012/0002370 A1 | 1/2012 | Ohsawa et al. | |
| 2012/0134098 A1 * | 5/2012 | Homer | G06F 1/20 361/679.33 |
| 2012/0140404 A1 | 6/2012 | Peterson et al. | |
| 2012/0236501 A1 | 9/2012 | Nagasawa | |
| 2012/0238141 A1 * | 9/2012 | Koyama | H01R 13/2464 439/625 |
| 2012/0251057 A1 * | 10/2012 | Yi | G02B 6/4246 385/92 |
| 2013/0094145 A1 | 4/2013 | Campbell et al. | |
| 2013/0114203 A1 * | 5/2013 | Ignatchenko | G06F 1/1632 361/679.41 |
| 2013/0152989 A1 * | 6/2013 | Krinn | F01N 5/025 136/210 |
| 2013/0194745 A1 | 8/2013 | Meijer et al. | |
| 2013/0194747 A1 | 8/2013 | Nagasawa | |
| 2013/0265722 A1 * | 10/2013 | Hill | G06F 1/203 361/707 |
| 2013/0279115 A1 | 10/2013 | Blumenthal | |
| 2014/0146475 A1 | 5/2014 | Buckman et al. | |
| 2014/0192480 A1 | 7/2014 | Winkler et al. | |
| 2014/0268553 A1 | 9/2014 | Van Pelt et al. | |
| 2014/0293542 A1 | 10/2014 | Vetrovec | |
| 2014/0376178 A1 | 12/2014 | Moore et al. | |
| 2015/0173242 A1 * | 6/2015 | Blomberg | F28D 15/0266 62/259.2 |
| 2015/0198380 A1 * | 7/2015 | Haj-Hariri | B64G 1/50 62/3.2 |
| 2015/0205355 A1 * | 7/2015 | Yairi | G06F 3/016 345/173 |
| 2015/0237762 A1 * | 8/2015 | Holt | H05K 7/20336 165/104.21 |
| 2015/0250074 A1 | 9/2015 | Matsumoto et al. | |
| 2015/0253823 A1 | 9/2015 | Han | |

(56) References Cited

U.S. PATENT DOCUMENTS

| | | | |
|---|---|---|---|
| 2015/0285573 A1* | 10/2015 | Stellman | F28F 13/00 |
| | | | 361/679.54 |
| 2015/0305205 A1 | 10/2015 | Gonzalez et al. | |
| 2016/0047362 A1* | 2/2016 | Dunham | F03G 7/05 |
| | | | 60/641.7 |
| 2016/0291652 A1* | 10/2016 | Rossi | H05K 7/20772 |
| 2017/0034900 A1* | 2/2017 | Strader | H05K 1/0203 |
| 2017/0170640 A1* | 6/2017 | Hansen | H02B 1/28 |
| 2017/0220074 A1* | 8/2017 | Cooper | G06F 1/1641 |
| 2017/0220082 A1* | 8/2017 | Jin | F28D 15/04 |
| 2017/0229375 A1* | 8/2017 | Haj-Hariri | H01L 23/427 |
| 2017/0303433 A1* | 10/2017 | Delano | H04B 1/3827 |
| 2017/0321966 A1* | 11/2017 | Lueckenbach | F28D 15/0233 |
| 2017/0370654 A1* | 12/2017 | Rice | F28D 15/046 |
| 2018/0234496 A1* | 8/2018 | Ratias | H04L 67/1095 |
| 2018/0260083 A1* | 9/2018 | Glickman | G06F 3/0482 |

OTHER PUBLICATIONS

"International Search Report & Written Opinion Issued in PCT Application No. PCT/US2017/021469", dated Jul. 5, 2017, 16 Pages.

U.S. Appl. No. 15/072,323, filed Mar. 16, 2016, David William Voth, Andrew Douglas Delano.

\* cited by examiner

THERMAL MANAGEMENT SYSTEM INCLUDING AN ELASTICALLY DEFORMABLE PHASE CHANGE DEVICE

PRIORITY

This application is a continuation of U.S. application Ser. No. 15/072,323, filed on Mar. 16, 2016, which is hereby incorporated by reference in its entirety.

BRIEF DESCRIPTION OF THE DRAWINGS

For a more complete understanding of the disclosure, reference is made to the following detailed description and accompanying drawing figures, in which like reference numerals may be used to identify like elements in the figures.

Figure 1:
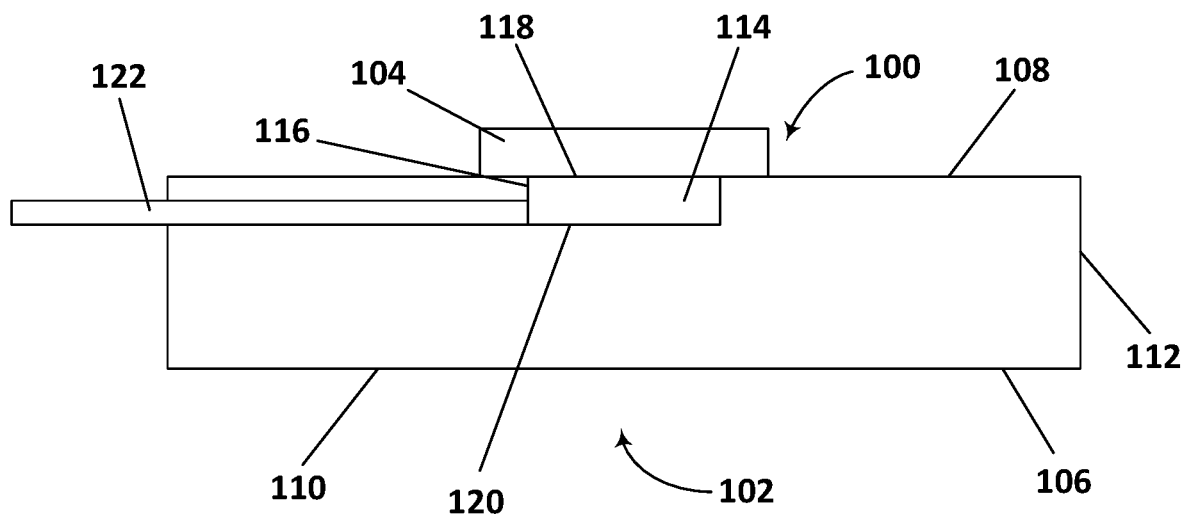
FIG. 1 depicts a front view of an example of a thermal management system.

While the disclosed devices, systems, and methods are representative of embodiments in various forms, specific embodiments are illustrated in the drawings (and are hereafter described), with the understanding that the disclosure is intended to be illustrative, and is not intended to limit the claim scope to the specific embodiments described and illustrated herein.

DETAILED DESCRIPTION

Current microprocessor design trends include designs having an increase in power, a decrease in size, and an increase in speed. This results in higher power in a smaller, faster microprocessor. Another trend is towards lightweight and compact electronic devices. As microprocessors become lighter, smaller, and more powerful, the microprocessors also generate more heat in a smaller space, making thermal management a greater concern than before.

The purpose of thermal management is to maintain the temperature of a device within a moderate range. During operation, electronic devices dissipate power as heat that is to be removed from the device. Otherwise, the electronic device will get hotter and hotter until the electronic device fails, reducing service life of the electronic device. Short of failure, electronic devices run slowly and dissipate power poorly at high temperatures.

As devices get smaller (e.g., thinner), thermal management becomes more of an issue. Depending on the thickness of the device, there may not be sufficient room within the device for active thermal management components such as, for example, fans. Also, as mobile devices (e.g., phones and tablets) replace larger laptop and desktop computers, the microprocessors may sometimes be tasked with running a full desktop environment and may thus generate more heat. The mobile device may be positioned on a thermal dock to remove enough heat from the mobile device so that the mobile device may run the full desktop environment. Direct mechanical coupling of the mobile device with the thermal dock for heat removal may have reliability issues in that a mechanical force applied by the thermal dock to the mobile device may be applied directly to sensitive components (e.g., a processor) within the mobile device. Indirect mechanical coupling of the mobile device with the thermal dock may limit heat removal capacity.

Disclosed herein are apparatuses, systems, and methods for improved heat dissipation from an electronic device. The improved heat dissipation within the electronic device may be provided by a deformable phase change device (e.g., a heat pipe) physically connected to a heat generating component (e.g., a processor) of the electronic device. When the electronic device is docked on a thermal dock or another heat sinking mechanism, the thermal dock elastically deforms a housing of the electronic device and the heat pipe. The deformed heat pipe decreases the thermal resistance between the heat generating component and the thermal dock and provides mechanical strain relief for one or more components within the electronic device (e.g., the processor to which the deformable heat pipe is attached).

As an example, the improved heat dissipation for an electronic device may be implemented by a thermal management system that includes components of a computing device and components of a thermal dock. The computing device includes a housing and a heat generating component supported by the housing. The thermal dock includes a housing and a thermal management device supported by the housing. The computing device includes a first phase change device, and/or the thermal dock includes a second phase change device. The first phase change device is physically connected to the heat generating component of the computing device, and/or the second phase change device is physically connected to the thermal management device of the thermal dock. The first phase change device and/or the second phase change device is compressible, such that the first phase change device and/or the second phase change device is compressed and the heat generating component of the computing device and the thermal management device of the thermal dock are physically and conductively connected when the computing device is docked with the thermal dock.

Such heat dissipation apparatuses, systems, or methods have several potential end-uses or applications, including any electronic device having a passive or an active cooling component (e.g., fan). For example, the heat dissipation apparatus may be incorporated into personal computers, server computers, tablet or other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. In certain examples, the heat dissipation apparatus may be incorporated within a wearable electronic device, where the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

Using one or more of these features described in greater detail below, improved heat dissipation may be provided for the electronic device. With the improved heat dissipation feature, a more powerful microprocessor may be installed for the electronic device, a thinner electronic device may be designed, a higher processing speed may be provided, or a combination thereof may be provided when compared to a similar electronic device without one or more of the improved heat dissipation features. In other words, the heat dissipation features described herein may provide improved thermal management for an electronic device such as a mobile phone, tablet computer, or laptop computer.

FIG. 1 depicts a front view of an example of a thermal management system 100. The thermal management system 100 includes a heat sink device 102 and components of an electronic device 104. The heat sink device 102 is, for example, a thermal dock on which the electronic device 104 may be positioned. The thermal dock 102 includes a housing 106 having a top 108, a bottom 110, and at least one side 112. The housing 106 supports a heat sink 114. In the example shown in FIG. 1, the housing 106 includes a recess 116 in which the heat sink 114 is supported. The heat sink 114 is positioned in the housing 106 such that a top 118 of the heat sink 114 is flush with or above the top 108 of the housing 106. In other examples, the recess 116 is on other sides and/or located at other positions within the housing 106. In one example, the housing 106 itself acts as the heat sink device. For example, the heat sink device 102 is a solid or hollow piece of thermally conductive material on which the electronic device 104 is positioned.

The housing 106 may be made of any number of materials. For example, the housing 106 is made of any number of thermally conductive materials such as, for example, copper or aluminum. Alternatively or additionally, the housing 106 may be at least partially made of any number of insulators including, for example, plastics. In one example, the housing 106 is made of a solid piece of material (e.g., a thermally conductive material such as aluminum). In another example, the housing 106 is hollow and is made of an insulator (e.g., plastic). In one example, at least one side of the housing 106 is open to provide access inside the heat sink device 102. For example, the housing 106 is hollow, and a first side and a second side opposite the first side, which extend between the top 108 and the bottom 110 of the housing 106, are open. This configuration of the housing allows air flow through the heat sink device 102.

In the example shown in FIG. 1, the heat sink 114 is a Peltier device. In other examples, the housing 106 may support other heat sinks such as one or more phase change devices (e.g., a heat pipe and/or a vapor chamber). A Peltier device is a solid-state heat pump that transfers heat from one side of a device to another. The direction of the heat transfer depends on the direction of current through the Peltier device. Peltier devices include two different types of semiconductors (e.g., an n-type semiconductor and a p-type semiconductor) with different electron densities. The semiconductors are joined with a layer of thermally conductive material (e.g., aluminum or copper) on each of two sides of the semiconductors. The semiconductors are electrically in series. Voltage is applied to the semiconductors, and DC current flows across a junction of the semiconductors. This causes a temperature difference. The cold side absorbs heat and moves the heat to the hot side. A plurality of fins may be disposed on the hot side (e.g., extend away from the layer of thermally conductive material on the hot side). The plurality of fins help remove heat from the hot side. Different Peltier devices may produce different maximum temperature differences between the cold side and the hot side. The fins on the hot side may help decrease the temperature on the hot side and thus, also on the cold side. Peltier devices also have different power ratings that correspond to the rate at which the cold side cools down an object thermally connected to the Peltier device (e.g., the electronic device 104).

Current runs through the Peltier device 114 such that the top 118 is the cold side and a bottom 120 of the Peltier device 114 is the hot side. Other configurations may be provided. Power is provided to the Peltier device 114 via cables 122 (e.g., a positive cable and a negative cable) extending through the housing 106 of the heat sink device 102.

Different Peltier devices with different maximum temperature differences and different power ratings may be selected for different thermal docks depending on the device to be cooled. As an example, the electronic device 104 is a mobile device (e.g., a phone or a tablet), and the Peltier device 114 positioned within the housing 106 is selected such that a processor within the mobile device 104 is cool enough to operate a desktop environment when the mobile device 104 is positioned on the Peltier device 114.

The heat sink device 102 may include any number of additional and/or different components. For example, the heat sink device 102 may include one or more fans supported by the housing 106 (e.g., positioned in the housing 106). The one or more fans may move air through the plurality of fins extending away from the hot side to aid in heat removal away from the hot side.

Mechanical coupling of the electronic device 104 with the heat sink device 102 for heat removal may cause reliability issues over time in that a mechanical force applied by the heat sink device 102 to the electronic device 104 may also be applied to sensitive components within the electronic device 104. Through the life of the electronic device 104, as the electronic device 104 is docked with the heat sink device 102 more and more, the stress on the sensitive components within the electronic device 104 over time may cause one or more of the components to fail.

Figure 2:
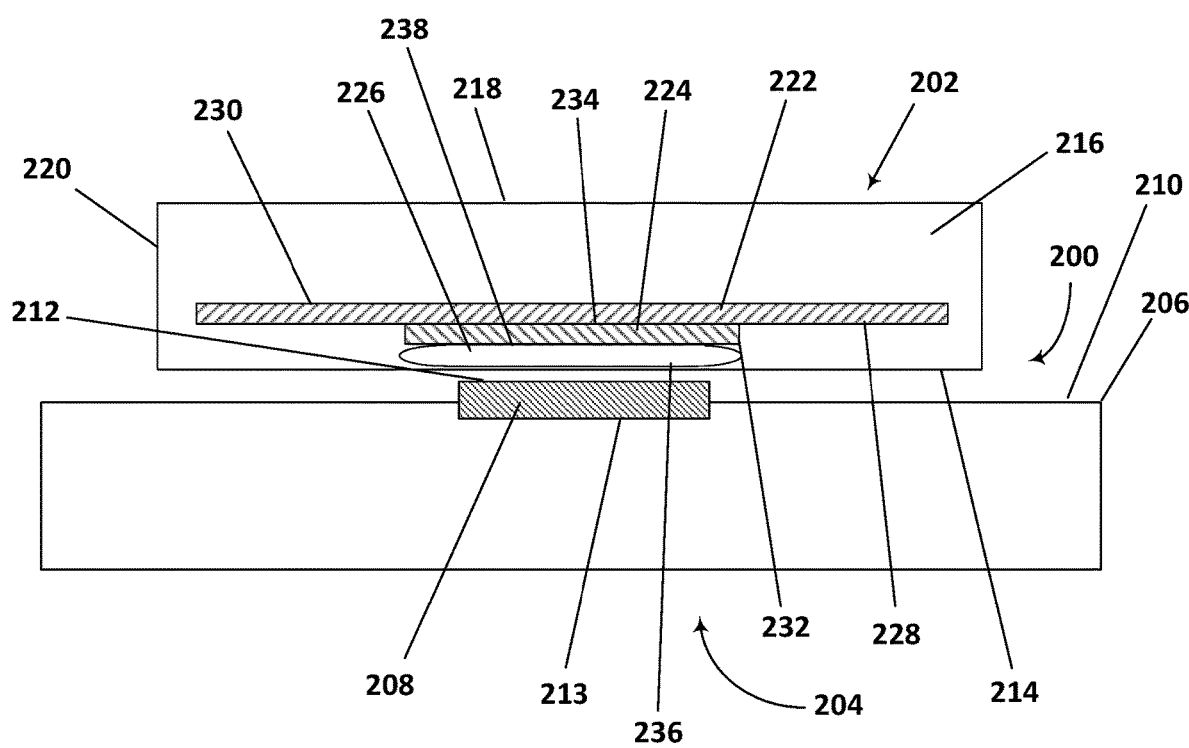
FIG. 2 depicts a cross section of a portion of an example of a thermal management system with a phase change device in a decompressed state.

FIG. 2 depicts a cross section of a portion of an example of a thermal management system 200. The thermal management system 200 includes a portion of an electronic device 202 (e.g., a mobile device such as a mobile phone or a tablet) and a portion of a heat sink device 204. In the example shown in FIG. 2, the heat sink device 204 includes a housing 206 and a Peltier device 208 supported by the housing 206. The housing 206 may include a recess (see FIG. 1) in which the Peltier device 208 is supported and disposed. The Peltier device 208 may be supported by the housing 206 in any number of other ways including, for example, by being physically attached to an outer surface (e.g., a top surface 210) of the housing 206.

The Peltier device 208 includes a first side 212 and a second side 213. In the example shown in FIG. 2, the first side 212 is a cold side of the Peltier device 208 and is a side closest to a device (e.g., the mobile device 202) docking with the heat sink device 204. The first side 212 of the Peltier device 208 may be positioned above the top surface 210 of the housing 206 of the heat sink device 204 such that the first side 212 of the Peltier device 208 abuts a surface of the electronic device 202 (e.g., a first side 214 or bottom of the electronic device 202) when the electronic device 202 is docked with the heat sink device 204.

The electronic device 202 includes a housing 216 having the first side 214 (e.g., the bottom), a second side 218 (e.g., a top), and at least one third side 220 extending between the first side 214 and the second side 218. In the example shown in FIG. 2, the electronic device 202 is a mobile phone, the first side 214 is part of a chassis of the mobile phone 202, and the second side 218 is part of a display of the mobile phone 202.

The mobile phone 202, for example, includes a printed circuit board (PCB) 222, one or more heat generating components 224 (e.g., a processor), and a phase change device 226. The PCB 222, the processor 224, and the phase change device 226 are supported by the housing 216 of the mobile phone 202. In the example shown in FIG. 2, the PCB 222, the processor 224, and the phase change device 226 are supported entirely within the housing 216 of the mobile phone 202. For example, the PCB 222 may be physically connected to an inner surface of the housing 216 using one or more connectors including, for example, screws, nut/bolt combinations, flanges, tabs, and/or other connectors, and the processor 224 and the phase change device 226 may be supported by the PCB 220. The mobile phone 202 may include any number of additional and/or different components including, for example, one or more fans, a power supply, memory, display components, and/or other components. The example of FIG. 2 shows a single PCB 222 with components only on one side of the PCB 222 (e.g., a first side 228 or a bottom side of the PCB 222). In other examples, more than one PCB 222 may be supported within the housing 216 and/or components may be supported on more than one side of the PCB 222 (e.g., the first side 228 and a second side 230 or top side of the PCB 222).

The processor 224 may, for example, be an integrated circuit and may be in die form or in package form. The processor 224 includes a first side 232 (e.g., a top side or an exposed side) and a second side 234 (e.g., a bottom side). The second side 234 of the processor 224 abuts the first side 228 of the PCB 222. The processor 224 is physically attached to and electrically connected to the PCB 222 in any number of ways including, for example, with solder. The processor 224 may be physically attached directly to the PCB 222, or one or more intervening components may be disposed between the processor 224 and the PCB 222. In one example, the processor 224 of FIG. 2 represents more than one heat generating component, and each of the heat generating components is physically attached to and electrically connected to the PCB 222.

The phase change device 226 includes a first side 236 and a second side 238. The second side 238 of the phase change device 226 is physically connected to and/or abuts the first side 232 of the processor 224. In one example, the phase change device 226 is physically attached directly to the processor 224 (e.g., with one or more connectors connected to the PCB 222). In another example, one or more intervening components and/or layers of material are disposed between the phase change device 226 and the processor 224. For example, a layer of thermal adhesive (e.g., thermal paste) or thermal grease may be disposed between the phase change device 226 and the processor 224. The phase change device 226 may extend across a single heat generating component (e.g., the processor 224) or may extend across a plurality of heat generating components (e.g., across the processor 224 and a memory).

The phase change device 226 may be, for example, a heat pipe and/or a vapor chamber. The phase change device 226 includes a vapor space and capillary features (not shown). The vapor space is a path for evaporated working fluid to travel to a condenser, and the capillary features are a pathway for condensed working fluid to return to an evaporator. The phase change device 226 is made of elastic material that is thermally conductive. For example, the phase change device 226 is made of a spring metal material such as, for example, an elastic copper alloy, an elastic aluminum alloy, an elastic titanium alloy, and/or another material. In another example, the phase change device is made of graphene. Walls defining the vapor space, or the walls and capillary features of the phase change device 226 are made of, for example, the spring metal material, such that the phase change device 226 is compressible when a force is applied to the phase change device 226, and the phase change device 226 is decompressible (e.g., elastic) when the force is removed from the phase change device 226. The phase change device 226 may return to an original size and shape once the force is removed from the phase change device 226.

In one example, the heat sink device 204 includes a phase change device. The phase change device of the heat sink device 204 may be disposed on the cold side of a Peltier device of the heat sink device 204. The phase change device of the heat sink device 204 may be instead of or in addition to the phase change device 226 of the electronic device 202.

Figure 3:
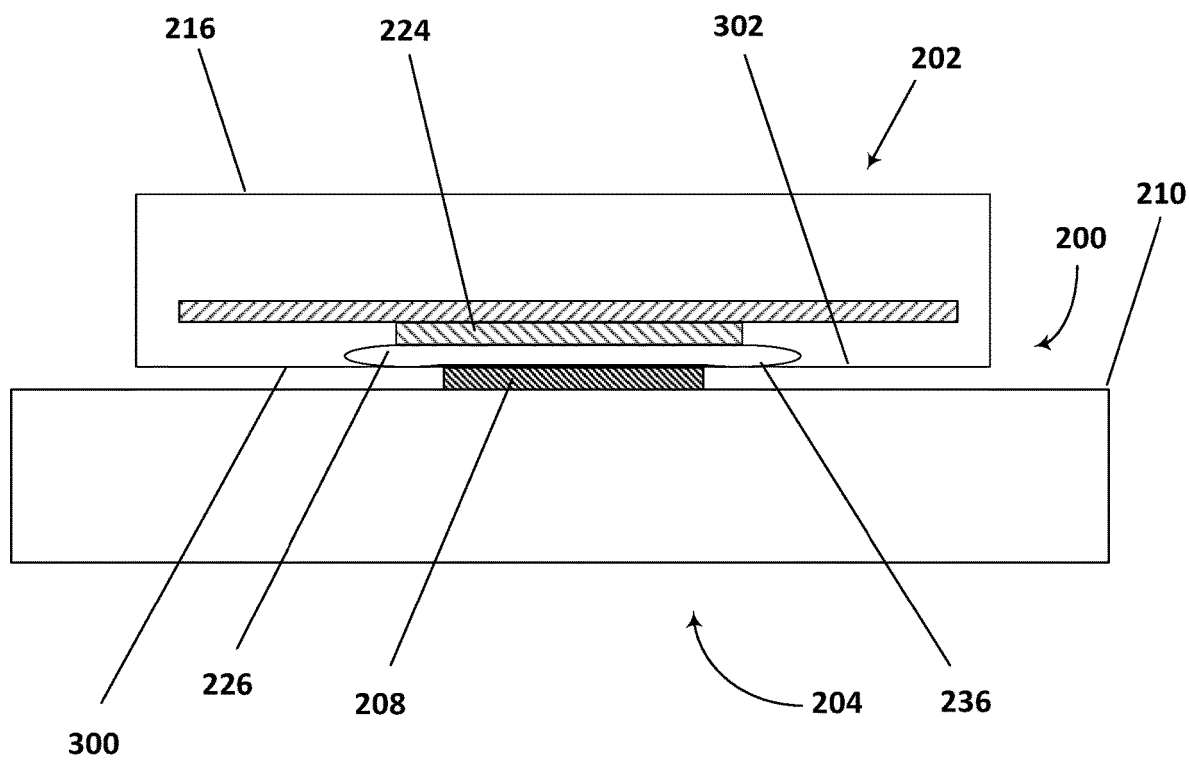
FIG. 3 depicts a cross section of a portion of an example of a thermal management system with a phase change device in a compressed state.

FIG. 3 depicts a cross section of a portion of an example of the thermal management system 200 with a portion of the electronic device 202 in a compressed state. When the electronic device 202, for example, is docked with the heat sink device 204, an outer surface 300 of the electronic device 202 flexes. In the example shown in FIG. 3, the outer surface 300 of the electronic device 202 is an outer surface of the chassis of the electronic device 202. The chassis of the electronic device 202 may be made of an elastic material (e.g., a plastic) that flexes when the electronic device 202 is docked with the heat sink device 204. Docking of the electronic device 202, for example, with the heat sink device 204 may include placing the electronic device 202 on the outer surface 210 of the housing 206 of the heat sink device 204 including the Peltier device 208. The Peltier device 208 may extend beyond the outer surface 210 of the housing 206 of the heat sink device 204 such that the Peltier device 208 applies a normal force on the outer surface 300 of the electronic device 202 in response to the gravitational force acting on the electronic device 202. In one example, the outer surface 300 of the electronic device 202 (e.g., the mobile phone) forms a recess sized and shaped to fit the Peltier device 208. The recess in the housing 216 of the mobile phone 202, for example, may provide guidance for proper positioning of the mobile phone 202 on the heat sink device 204 to align the Peltier device 208 with the phase change device 226 and the processor 224, for example. In another example, the outer surface 300 of the mobile phone 202 includes an opening, such that the phase change device 226 is exposed. In such a configuration, the Peltier device 208 is in direct physical contact with the phase change device 226 when the mobile phone 202 is docked with the heat sink device 204.

The mobile phone 202, for example, may be docked with the heat sink device 204 in any number of other ways. In one example, a side of the housing 206 of the heat sink device 204 includes a recess into which the mobile phone 202 may be positioned. The Peltier device 208 may be positioned beneath the recess. A distance across the recess may be the same or smaller than the thickness of the mobile phone 202, such that when the mobile phone 202 is positioned inside the recess, the outer surface 300 of the mobile 202 is forced into physical contact with the Peltier device 208.

When the housing 216 of the mobile phone 202, for example, flexes, the normal force applied to the outer surface 300 of the mobile phone 202 is translated to the phase change device 226 (e.g., the first side 236 of the phase change device 226). For example, with the application of the normal force by the Peltier device 208 on the outer surface 300 of the mobile phone 202 and the resultant flexing of the housing 216 of the mobile phone 202, an inner surface 302 of the housing 216 of the mobile phone 202 moves into contact with the first side 236 of the phase change device 226. In other words, the inner surface 302 of the housing 216 of the mobile phone 202 is at a distance from the phase change device 226 when the mobile phone 202 is in an undocked state, and moves into contact with the phase change device 226 when the mobile phone 202 is in a docked state. A maximum movement of the housing 216 as a result of the flexing may be measured in microns. In other examples, the flexing may cause more or less movement of the housing 216 based on the material used for the housing 216 and the dimensions (e.g., the thickness) of the housing 216. In one example, the phase change device 226 is already in physical contact with the inner surface 302 of the housing 216 of the mobile phone 202 when the mobile is in an undocked state. In other words, the phase change device 226 is always in physical contact with the inner surface 302 of the housing 216 of the mobile phone 202.

As illustrated with the example shown in FIG. 3, with the flexing of the housing 216 of the mobile phone 202 and thus the inner surface 302 of the housing 216, the phase change device 226 is compressed by the inner surface 302 of the housing 216. The contact of the housing 216 of the mobile phone 202 with the phase change device 226 and the resultant compression of the phase change device 226 reduces the thermal resistance between the heat sink device 204 (e.g., the Peltier device 208) and the heat generating component 224 (e.g., the processor), and thus increases the efficiency of heat removal from the mobile phone 202. The compression of the phase change device 226 also reduces the stress on the processor 224, for example, as a result of the docking process. The mobile phone 202, for example, may be docked many times (e.g., thousands of times) and not suffer reliability issues. With each docking, the phase change device 226 elastically deforms, spreading the attachment force and preventing damage to the processor 224, for example. When undocked, the phase change device 226 returns to an original size and shape.

In one example, the phase change device 226 is a bellows heat pipe. The bellows heat pipe 226 is expandable such that when a pressure within the bellows heat pipe 226 increases with increasing temperature, a force applied to an inner surface of the bellows heat pipe 226 causes the first side 236 of the bellows heat pipe 226 to move into contact or maintain contact with the inner surface 302 of the housing 216. Different working fluids within the bellows heat pipe may be used to provide different expansions at different temperatures. The mobile phone 202, for example, including the bellows heat pipe 226 may be used with the example of the heat sink device 204 that includes the recess sized for the mobile phone 202 (e.g., the distance across the recess is the same or less than the thickness of the mobile phone 202). Positioning the mobile phone 202 within the recess of the heat sink device 204 prevents the outer surface 300 of the mobile phone 202 from flexing when the bellows heat pipe 226 expands. This reduces the thermal resistance between the heat sink device 204 (e.g., the Peltier device 208) and the heat generating component 224.

In another example, the phase change device 226 includes a piece of thermally conductive material (e.g., a solid piece) physically attached to the first side 236 of the phase change device 226. The piece of thermally conductive material is physically attached to the first side 236 of the phase change device 226 with, for example, solder. The piece of thermally conductive material is made of a different material than the phase change device 226. For example, the piece of thermally conductive material is made of a material with a different coefficient of thermal expansion than the phase change device 226 (e.g., the coefficient of thermal expansion for the phase change device 226 is greater than the coefficient of thermal expansion for the piece of thermally conductive material). In one example, the piece of thermally conductive material is longer than the phase change device 226. The piece of thermally conductive material may be soldered to the phase change device 226 at a temperature the phase change device 226 may reach during operation. The different coefficients of thermal expansion combined with the increase in temperature during soldering causes an end of the piece of thermally conductive material (e.g., an end free to move) to move away from the phase change device 226. When the piece of thermally conductive material and the phase change device 226 have cooled, the piece of thermally conductive material and the phase change device 226 are flat and parallel. During operation of the mobile phone 202, for example, as the temperatures of the piece of thermally conductive material and the phase change device 226, respectively, increase, the free end of the piece of thermally conductive material moves towards and into contact with the inner surface 302 of the housing 216. This reduces the thermal resistance between the heat sink device 204 (e.g., the Peltier device 208) and the heat generating component 224.

The elastic phase change device (e.g., made of spring metal) allows for the attachment of very thin high powered electronics to a thermal dock. The elastic phase change device may be directly bonded to a heat generating component (e.g., an integrated circuit) of a device to be docked such as, for example, a mobile phone or a tablet. The extraction of heat from the integrated circuit, for example, improves performance of the device, as better heat removal allows the mobile phone or tablet to operate at a higher power for a longer period of time. The elastic phase change device deforms and springs back when pressed. The elastic phase change device may improve heat conduction away from the integrated circuit while also providing strain relief. When the elastic phase change device deforms, the force of attaching the device to the dock may be spread out and not applied directly to the heat generating component.

Figure 4:
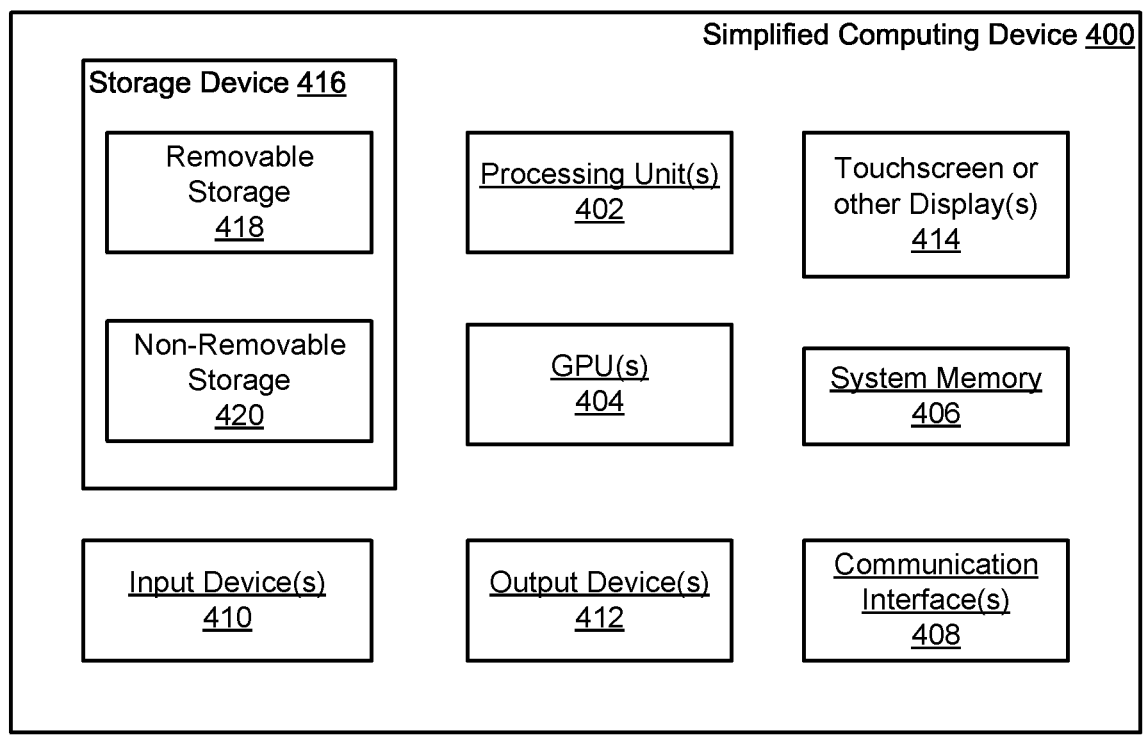
FIG. 4 is a block diagram of a computing environment in accordance with one example for implementation of the disclosed methods or one or more electronic devices.

With reference to FIG. 4, a thermal management system, as described above, may be incorporated within an exemplary computing environment 400. The computing environment 400 may correspond with one of a wide variety of computing devices, including, but not limited to, personal computers (PCs), server computers, tablet and other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. For example, the heat dissipating apparatus is incorporated within a computing environment having an active cooling source (e.g., fan).

The computing environment 400 has sufficient computational capability and system memory to enable basic computational operations. In this example, the computing environment 400 includes one or more processing units 402, which may be individually or collectively referred to herein as a processor. The computing environment 400 may also include one or more graphics processing units (GPUs) 404. The processor 402 and/or the GPU 404 may include integrated memory and/or be in communication with system memory 406. The processor 402 and/or the GPU 404 may be a specialized microprocessor, such as a digital signal processor (DSP), a very long instruction word (VLIW) processor, or other microcontroller, or may be a general purpose central processing unit (CPU) having one or more processing cores. The processor 402, the GPU 404, the system memory 406, and/or any other components of the computing environment 400 may be packaged or otherwise integrated as a system on a chip (SoC), application-specific integrated circuit (ASIC), or other integrated circuit or system.

The computing environment 400 may also include other components, such as, for example, a communications interface 408. One or more computer input devices 410 (e.g., pointing devices, keyboards, audio input devices, video input devices, haptic input devices, or devices for receiving wired or wireless data transmissions) may be provided. The input devices 410 may include one or more touch-sensitive surfaces, such as track pads. Various output devices 412, including touchscreen or touch-sensitive display(s) 414, may also be provided. The output devices 412 may include a variety of different audio output devices, video output devices, and/or devices for transmitting wired or wireless data transmissions.

The computing environment 400 may also include a variety of computer readable media for storage of information such as computer-readable or computer-executable instructions, data structures, program modules, or other data. Computer readable media may be any available media accessible via storage devices 416 and includes both volatile and nonvolatile media, whether in removable storage 418 and/or non-removable storage 420. Computer readable media may include computer storage media and communication media. Computer storage media may include both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may accessed by the processing units of the computing environment 400.

Figure 5:
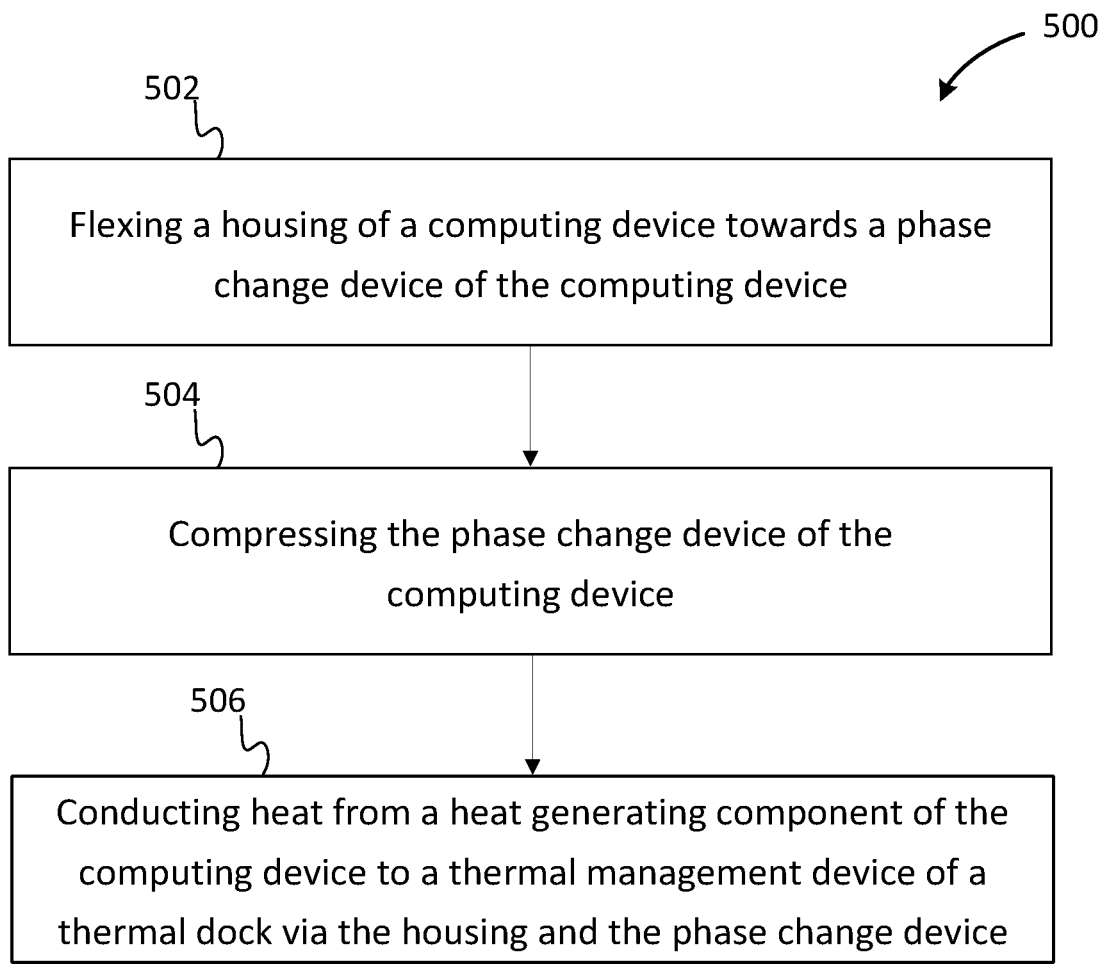
FIG. 5 is a flow diagram of a method for transferring heat from a computing device to a thermal dock in accordance with one example.

FIG. 5 shows a flowchart of one example of a method 500 for transferring heat from a heat generating component of a computing device to a thermal management device of a thermal dock. The method 500 is implemented in the order shown, but other orders may be used. Additional, different, or fewer acts may be provided. Similar methods may be used for transferring heat.

In act 502, a portion of a housing of the computing device is flexed towards a phase change device of the computing device. The computing device is, for example, a mobile phone, a tablet, or another electronic device (e.g., operable to run a desktop environment), and the phase change device includes, for example, a heat pipe and/or a vapor chamber. The phase change device is physically connected to the heat generating component of the computing device. For example, the phase change device is physically connected to the heat generating component of the computing device with, for example, a layer of thermal adhesive (e.g., thermal paste). The heat generating component may be any number of components housed within the computing device including, for example, a processor.

The housing of the computing device is flexed towards the phase change device of the computing device in response to a force applied to an external surface of the housing. The force applied to the external surface of the housing may, for example, include a normal force opposing a gravitational force acting on the computing device, applied by the thermal management device of the thermal dock. For example, the thermal management device may be a Peltier device, and a surface of the Peltier device may apply the normal force to the external surface of the housing of the computing device when the computing device is docked with the thermal dock. The housing of the computing device may be made of an elastic material (e.g., an elastic plastic) and may flex in response to the applied force. The housing may return to an original position relative to the processor when the applied force is removed.

When the housing of the computing device is flexed towards the phase change device in response to the applied force, an internal surface of the housing of the computing device moves from a position at a distance from the phase change device into physical contact with the phase change device. In one example, the internal surface of the housing of the computing device is always in contact with the phase change device.

In act 504, the phase change device of the computing device is compressed. In response to the applied force, the internal surface of the housing of the computing device moves into physical contact with the phase change device, and the internal surface of the housing compresses the phase change device. The phase change device is made of a thermally conductive elastic material. For example, the phase change device is made of a spring metal such as a copper alloy, an aluminum alloy, or a titanium alloy. Alternatively, the phase change device is made of graphene. The phase change device returns to an original size and/or shape when the applied force is removed.

In act 506, heat is conducted from the heat generating component of the computing device to the thermal management device (e.g., the Peltier device) of the thermal dock via the housing and the phase change device. The Peltier device acts as a heat pump and removes heat from the computing device. This allows the computing device to operate at a higher power for a longer period of time. In one example, the computing device may operate a desktop environment at least when the computing device is docked with the thermal dock. Compared to the prior art, the elastic phase change device decreases the thermal resistance between the processor and the Peltier device, for example, and also decreases the stress on the processor from the applied force.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

In a first embodiment, a computing device includes a housing. The housing includes an outer surface and an inner surface. The computing device also includes a heat generating component supported by the housing, and a phase change device adjacent or physically connected to the heat generating component. The phase change device includes a first portion and a second portion. The first portion is closer to the heat generating component than the second portion. The second portion is opposite the first portion. The phase change device is elastically compressible, such that when a force is applied to a portion of the outer surface of the housing, the inner surface of the housing flexes towards the second portion of the phase change device and the phase change device is compressed. Alternatively or additionally, the phase change device is elastically expandable, such that when a force is applied to the phase change device from within the phase change device, the phase change device moves into physical contact with the inner surface of the housing.

In a second embodiment, with reference to the first embodiment, the phase change device includes a heat pipe, a vapor chamber, or a combination thereof.

In a third embodiment, with reference to the second embodiment, the phase change device includes a bellows heat pipe.

In a fourth embodiment, with reference to the first embodiment, the phase change device is made of an elastic spring metal, such that when the applied force is removed, the phase change device expands or contracts.

In a fifth embodiment, with reference to the fourth embodiment, the housing is flexible away from the phase change device when the applied force is removed, such that the second portion of the phase change device is at a distance from the inner surface of the housing after the applied force is removed.

In a sixth embodiment, with reference to the first embodiment, the phase change device abuts the heat generating component.

In a seventh embodiment, with reference to the first embodiment, the computing device is a mobile phone operable to run a desktop environment.

In an eighth embodiment, with reference to the first embodiment, the force applied to the outer surface of the housing is a force applied to the outer surface of the housing when the computing device is docked with a thermal dock.

In a ninth embodiment, with reference to the first embodiment, the heat generating component includes a processor.

In a tenth embodiment, a thermal management system includes a computing device and a thermal dock. The computing device includes a housing and a heat generating component supported by the housing. The thermal dock includes a housing and a thermal management device supported by the housing. The computing device includes a first phase change device, the thermal dock includes a second phase change device, or a combination thereof. The first phase change device is physically connected to the heat generating component of the computing device, the second phase change device is physically connected to the thermal management device of the thermal dock, or a combination thereof. The first phase change device, the second phase change device, or the first phase change device and the second phase change device are compressible, such that the first phase change device, the second phase change device, or the first phase change device and the second phase change device are compressed and the heat generating component of the computing device and the thermal management device of the thermal dock are physically and conductively connected when the computing device is docked with the thermal dock.

In an eleventh embodiment, with reference to the tenth embodiment, the thermal management device of the thermal dock includes a Peltier device.

In a twelfth embodiment, with reference to the tenth embodiment, the housing of the computing device includes an outer surface and an inner surface. The computing device includes the first phase change device. The first phase change device includes a first side and a second side. The first side is closer to the heat generating component than the second side, and the second side is opposite the first side. The first phase change device is compressible, such that when a force is applied to the outer surface of the housing of the computing device, the inner surface flexes towards the second side of the first phase change device and the first phase change device is compressed.

In a thirteenth embodiment, with reference to the twelfth embodiment, the force applied to the outer surface of the housing of the computing device is a force applied to the outer surface when the computing device is docked with the thermal dock.

In a fourteenth embodiment, with reference the twelfth embodiment, the first phase change device, the second phase change device, or the first phase change device and the second phase change device are made of an elastic spring metal.

In a fifteenth embodiment, with reference to the fourteenth embodiment, the first phase change device made of the elastic spring metal is operable to decompress when the computing device is removed from the thermal dock and the inner surface of the housing of the computing device flexes away from the first phase change device.

In a sixteenth embodiment, with reference to the tenth embodiment, the computing device is a mobile phone operable to run a desktop environment when the mobile phone is docked with the thermal dock.

In a seventeenth embodiment, with reference to the tenth embodiment, the first phase change device includes a heat pipe, a vapor chamber, or a combination thereof, and the second phase change device includes a heat pipe, a vapor chamber, or a combination thereof.

In an eighteenth embodiment, a method for transferring heat from a heat generating component of a computing device to a thermal management device of a thermal dock includes flexing a housing of the computing device towards a phase change device physically connected to the heat generating component of the computing device in response to a force applied to an external surface of the housing by the thermal dock. The housing supports the heat generating component. The method also includes compressing, by the housing of the computing device, in response to the flexing, the phase change device physically connected to the heat generating component. The method also includes conducting heat from the heat generating component of the computing device to the thermal management device of the thermal dock via the phase change device and the housing of the computing device.

In a nineteenth embodiment, with reference to the eighteenth embodiment, the flexing includes moving an internal surface of the housing from a position at a distance from the phase change device into contact with the phase change device.

In a twentieth embodiment, with reference the eighteenth embodiment, the force applied to the external surface of the housing of the computing device includes a normal force opposing a gravitational force acting on the computing device applied by the thermal management device of the thermal dock.

In connection with any one of the aforementioned embodiments, the computing device, the thermal management system, or the method for transferring heat may alternatively or additionally include any combination of one or more of the previous embodiments.

The foregoing description is given for clearness of understanding only, and no unnecessary limitations should be understood therefrom, as modifications within the scope of the claims may be apparent to those having ordinary skill in the art.

The invention claimed is:

1. A computing device comprising:
a housing comprising an outer surface and an inner surface;
a heat generating component supported by the housing;
a phase change device physically connected to the heat generating component, wherein the phase change device comprises a heat pipe, a vapor chamber, or a combination thereof,
wherein the heat pipe, the vapor chamber, or the combination thereof is elastically deformable, such that when a force is applied to a portion of the housing, the housing flexes towards heat pipe, the vapor chamber, or the combination thereof and deforms the heat pipe, the vapor chamber, or the combination thereof.

2. The computing device of claim 1, wherein the phase change device is made of an elastic spring metal, such that when the applied force is removed, the phase change device expands.

3. The computing device of claim 2, wherein the housing is flexible away from the phase change device when the applied forced is removed, such that the phase change device is at a distance from the housing after the applied force is removed.

4. The computing device of claim 1, wherein the computing device is a mobile phone operable to run a desktop environment.

5. The computing device of claim 1, wherein the force applied to the outer surface of the housing is applied to the outer surface of the housing when the computing device is docked with a thermal dock.

6. The computing device of claim 5, wherein the thermal dock comprises a thermal dock housing and a thermal management device supported by the thermal dock housing, the thermal management device applying the force to the thermal dock housing when the computing device is docked with the thermal dock.

7. The computing device of claim 6, wherein the thermal management device comprises a Peltier device, an outer surface of the Peltier device being offset relative to an outer surface of the thermal dock housing, the outer surface of the Peltier device applying the force to the housing when the computing device is docked with the thermal dock.

8. A thermal management system comprising:
a thermal dock having a thermal dock housing;
a thermal management device supported by the thermal dock housing; and
a phase change device physically connected to the thermal management device, the phase change device being deformable when a force is applied to the phase change device by the thermal management device, wherein the force applied to the phase change device is a force applied to the phase change device when a computing device is docked with the thermal dock,
wherein the phase change device is made of an elastic spring metal.

9. The thermal management system of claim 8, wherein the thermal management device comprises a Peltier device.

10. The thermal management system of claim 8, wherein the phase change device made of the elastic spring metal is operable to compress when the computing device is docked with the thermal dock and decompress when the computing device is removed from the thermal dock.

11. The thermal management system of claim 8, wherein the phase change device comprises a heat pipe, a vapor chamber, or a combination thereof.

12. A method for transferring heat from a heat generating component of a computing device to a Peltier device of a thermal dock, the method comprising:
thermally connecting the heat generating component of the computing device to the Peltier device of the thermal dock, the thermally connecting comprising deforming a heat pipe or a vapor chamber of the computing device, the deformed heat pipe or vapor chamber abutting a housing of the computing device; and
conducting heat from the heat generating component of the computing device to the Peltier device of the thermal dock via the heat pipe or the vapor chamber and the housing of the computing device,
wherein deforming the heat pipe or the vapor chamber of the computing device comprises flexing the housing of the computing device towards the heat pipe or the vapor chamber in response to a force applied to an external surface of the housing by the Peltier device of the thermal dock.

13. The method of claim 12, wherein the flexing comprises moving an internal surface of the housing from a position at a distance from the heat pipe or the vapor chamber into physical contact with the heat pipe or the vapor chamber.

14. The method of claim 12, wherein the force applied to the external surface of the housing of the computing device comprises a normal force opposing a gravitational force acting on the computing device applied by the Peltier device of the thermal dock.

15. The method of claim 12, wherein deforming the heat pipe or the vapor chamber of the computing device comprises elastically deforming the heat pipe or the vapor chamber, where the heat pipe or vapor chamber is made of an elastic spring metal.

* * * * *